United States Patent [19]

Tellerman

[11] 4,298,861

[45] Nov. 3, 1981

[54] INTEGRATED ULTRASONIC MAGNETIC ENCODER

[75] Inventor: Jacob Tellerman, Bayside, N.Y.

[73] Assignee: Temposonics, Incorporated, Plainview, N.Y.

[21] Appl. No.: 922,819

[22] Filed: Jul. 10, 1978

[51] Int. Cl.³ ............................................... G06F 3/02
[52] U.S. Cl. .............................. 340/365 L; 178/17 C; 333/148
[58] Field of Search .......... 340/365 L, 365 A, 365 R; 333/148; 400/477, 479, 479.1, 479.2; 324/207, 208; 178/17 C; 179/90 K

[56] References Cited

U.S. PATENT DOCUMENTS 3,898,555  8/1975  Tellerman ........................... 333/148
4,144,519  3/1979  Chamuel ............................. 324/208

FOREIGN PATENT DOCUMENTS 1386070  3/1975  United Kingdom ........... 340/365 A
395829  1/1974  U.S.S.R. ......................... 340/365 L

OTHER PUBLICATIONS

*IBM Technical Disclosure Bulletin*, vol. 14, No. 10, Mar. 1972, p. 3199, Arosenius, L., "Ripple Sensing Keyboard."

"Magnetacoustic Keyboard", IBM Tech. Disclosure Bulletin, Calcagno et al., Feb. 1979, pp. 3843-3844.

*Primary Examiner*—James J. Groody
*Attorney, Agent, or Firm*—James P. Malone

[57] ABSTRACT

An ultrasonic waveguide provides the encoding of magnetic keys on a keyboard. The magnetic keys couple their respective magnetic fields to an ultrasonic waveguide producing signals in a given time relation to permit encoding by depressed keys. Since the necessary information appears essentially on two wires, the system is basically a very reliable solid state system where all basic signal processing takes place in an "integral" ultrasonic waveguide component. Potential simplicity, low cost construction, very high reliability, makes the application very suitable in keyboards for computers, data processing equipment, teletype equipment, computer time sharing stations, computerized reservation stations, display consoles, etc.

12 Claims, 8 Drawing Figures

INTEGRATED ULTRASONIC MAGNETIC ENCODER

At present, in conventional keyboard systems, any button on a keyboard when depressed provides a switch closure which subsequently must be detected and recognized. This recognition is performed by an electronic scanning technique whereby the switches have given positions in a matrix. The electronic techniques utilized are basically the same whether the push buttons are electrical contacts, magnetically excited reed switches, magnetic Hall effect detectors with semiconductor switches, capacitor plate buttons combined with semiconductor detectors, etc.

The ultrasonic waveguide method approach presented herein provides the scanning and recognizing of depressed keys within a single integrated system using only basically two wires to provide the required information. Thus, a simpler and more economical keyboard system addressing a computer or data processing system may be evolved. This invention eliminates the need for wiring to each key.

An important advantage is that the waveguides are magnetically coupled by keys and the waveguides may be sealed for protection from liquid spills, dust, dirt and other contaminants.

Prior art in keyboards has been devoted to providing switch closures for each key position on a keyboard, rather than an integrated magnet position sensing device proposed in this invention. The switch closure methods utilized in the past range from electrical contact pushbutton switches, including magnetic reed switches, to solid state switches excited by discrete "Hall" effect magnet proximity detectors. Capacity changes due to key depression were also detected and signals applied to solid state switches, to provide switch closure information.

Accordingly, the principal object of the invention is to provide new and improved keyboard encoding means.

Another object of the invention is to provide keyboard encoding means utilizing a single wire sonic waveguide in operative engagement with the keys.

Another object of the invention is to provide new and improved keyboard encoding system comprising a plurality of movable keys, a sonic waveguide in predetermined spaced relation to said keys, a magnet connected to each of said keys, means to apply a torsional pulse to said waveguide whereby when one of the keys is moved into magnetic engagement with said waveguide, a signal will be induced in said waveguide, said signal being delayed relative the applied pulse so that the moved key may be identified.

These and other objects of the invention will be apparent from the following specification and drawings of which:

Figure 1:
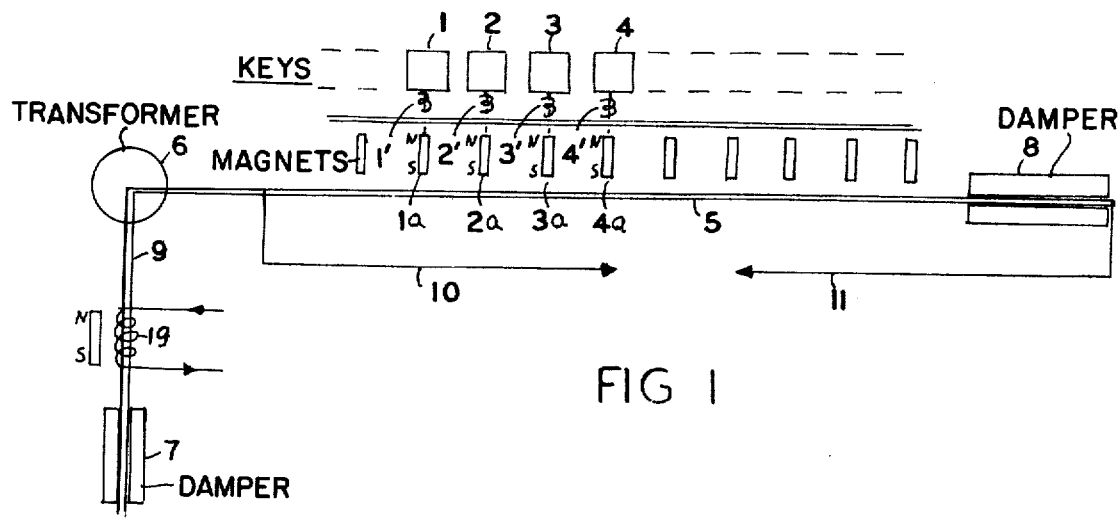
FIG. 1 is a schematic diagram of the embodiment of the invention.
Figure 1A:
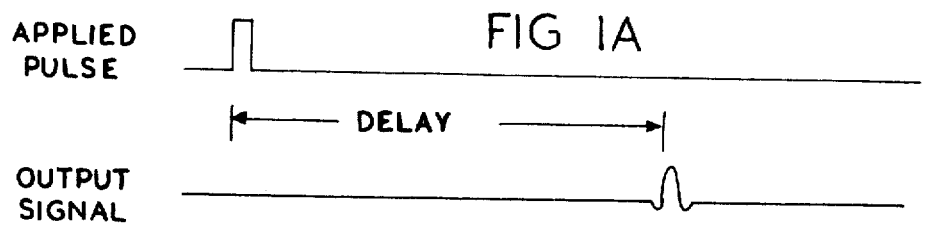
FIG. 1A is a graph illustrating the operation of FIG. 1.

Several methods exist whereby the presence of a longitudinal magnetic field along a ferromagnetic wire can be detected by utilizing ultrasonic torsional pulses. One method consists of applying a torsional strain pulse to a ferromagnetic waveguide as shown in FIGS. 1 and 1A and detecting the presence of a magnet by the induced voltage across the waveguide. Here, after the sonic pulse is launched by a longitudinal to torsional converter or mode transformer, a signal is induced when the torsional pulse traverses the longitudinal field applied by a small discrete magnet in the vicinity of the waveguide. The signal is delayed in time with respect to the applied pulse by a time interval equal to the inverse of the velocity of propagation of a torsional pulse on a wire. This velocity is related as follows:

$$v = K\sqrt{\frac{E_s}{P}}$$

Es is shear modulus of the wire.
P is the density of the wire.

Referring to FIG. 1, the keyboard comprises keys 1, 2, 3, 4, etc., which are movable in conventional manner, and are mounted so that they may be depressed by the operator. The keys are spring loaded by the springs 1', 2', 3', 4', etc. Attached to the keys are magnets 1a, 2a, 3a, 4a, etc. The sonic waveguide comprises a ferromagnetic wire 5 which extends along the row of magnets. One end of the waveguide 5 is connected to a longitudinal to torsional transformer 6, as shown in my U.S. Pat. No. 3,898,555.

The longitudinal to torsional transformer comprises a pair of magnetostrictive tapes, one connected to each side of the tubular waveguide. When a pulse is applied to the tapes, one pushes and one pulls on the tubular waveguide, applying a torsional strain which travels at sonic speed along the waveguide, as shown in my U.S. Pat. No. 3,898,555.

The input to the longitudinal to torsional transformer is a pair of magnetostrictive tapes 9. The other end of the tapes are mounted in a damping device 7, and the other end of the waveguide 5 is mounted in a damping device 8. One output lead 10 is connected to the waveguide 5 before the first magnet. The other output lead 11 is connected to the end of the waveguide 5. Pulses are applied to the magnetostrictive tapes 9 by means of a coupling coil 19.

FIG. 1A shows a graph of the applied pulse and output signal. The delay between the applied pulse and the output signal is related to the displacement of a particular key magnet along the waveguide. Therefore, all the keys can be identified. The delay between input and output pulses may be measured by conventional delay measuring means.

Thus, any of the magnets along the waveguide when brought toward the waveguide provide an output signal which can be identified by its relation in time with the applied pulse. If each of the magnets represent a key on the keyboard, the depressing of the key introduces a signal on the ultrasonic waveguide which can be associated with the key that has been depressed.

It should also be noted that a torsional pulse can be launched by applying a pulse current to the waveguide and at the location of the longitudinal field of the magnet along the waveguide, a torsional pulse may be launched. The arrival of the strain pulse can be detected at one end, either by a piezoelectric detector or a torsional to longitudinal transformer where the Villari effect is utilized to detect a change of magnetization due to a strain in the magnetic tapes coupled by a magnetic field. Here, the change of magnetization induces a voltage in coils coupling the tapes.

Figure 1B:
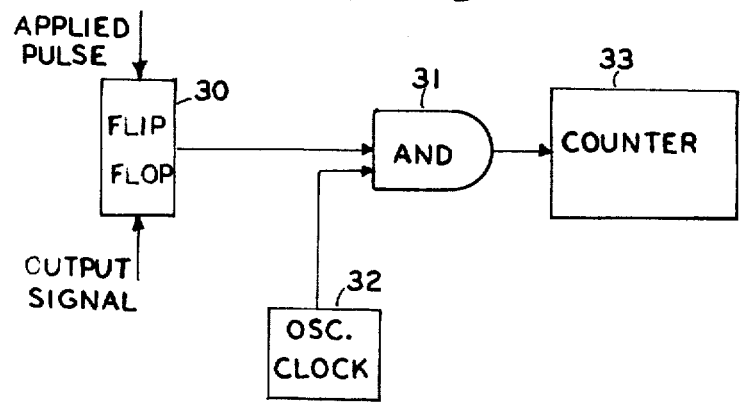
FIG. 1B shows means for providing a digital count.

FIG. 1B shows a system for providing a digital count. The applied pulse turns on the flip-flop 30 and the output signal turns off the flip-flop. The output gate of the flip-flop is applied to AND gate 31, the other input to AND gate 31 is a clock which may be a pulse oscillator 32. The gated timing pulses are counted by the counter 33 to provide a count of the measured time interval.

Methods of Implementation

Method 1—The conversion of the magnet position to a binary signal can be simply accomplished by measuring the delay of the magnet induced signal. Here, the delay between the applied torsional pulse and received pulse is converted into a time variable gate. This gate then controls the passage of a selected clock pulse train to a counter. The final count thus, represents a binary number related to magnet or key position. Similarly, a pulse width modulated gate can be generated when a torsional pulse is launched on the waveguide by a magnet position and then received at one end of the waveguide, as shown in my above mentioned U.S. Pat. No. 3,898,555.

Method 2—Another method of decoding the particular key depressed is by magnetically coding the keys. By using a binary code for example, of 5 bits, 32 keys can be decoded. This can be accomplished as follows:

One magnet indicates the initiation of the code word and generates a pulse. Thereafter, a strobe timing pulse train is generated. If a magnet is present, a signal is generated signifying a "1". For a lack of magnet in a given time spot, an "o" is detected. Thus, a binary code can be generated for each key depressed. See FIGS. 2 and 2A.

Figure 2A:
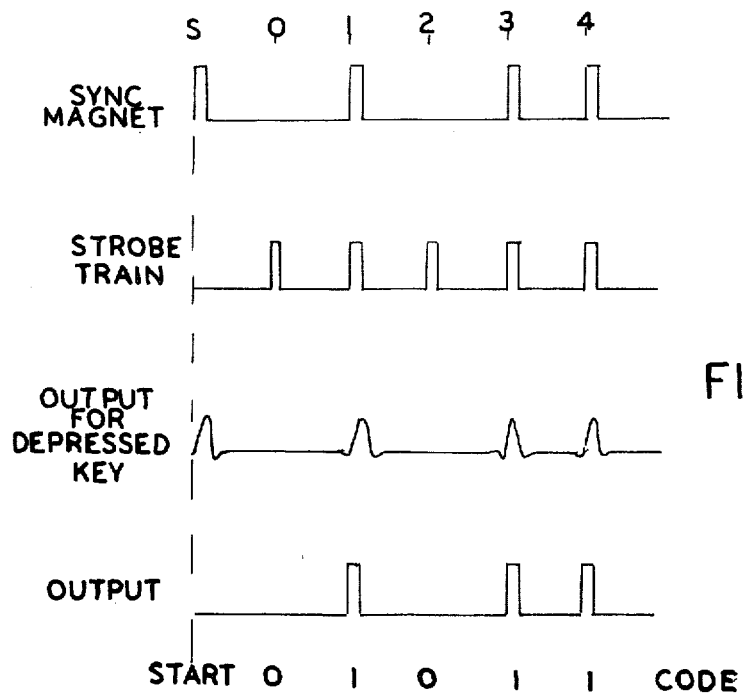
FIG. 2A is a graph illustrating the operation of FIG. 2.
Figure 2:
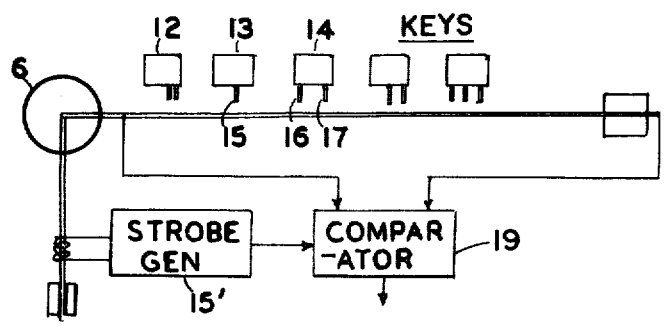
FIG. 2 is a schematic diagram of another embodiment of the invention.

In FIG. 2, the keys 12, 13, 14, etc., each have a plurality of magnets, 15, 16, 17, the magnets for each key being arranged differently so as to provide a binary code. The strobe timing pulse train is generated by the strobe timing pulse generator 15'. As illustrated in FIG. 2A if a magnet of a depressed key is in magnetic engagement in a predetermined time slot with the waveguide, a signal is generated signifying "1". If there is no magnet in the time slot, "o" is detected. Therefore, the binary code can be generated for each key depressed by feeding the output signals and the strobe generator signals to a comparator 16.

Construction Considerations

Figure 3:
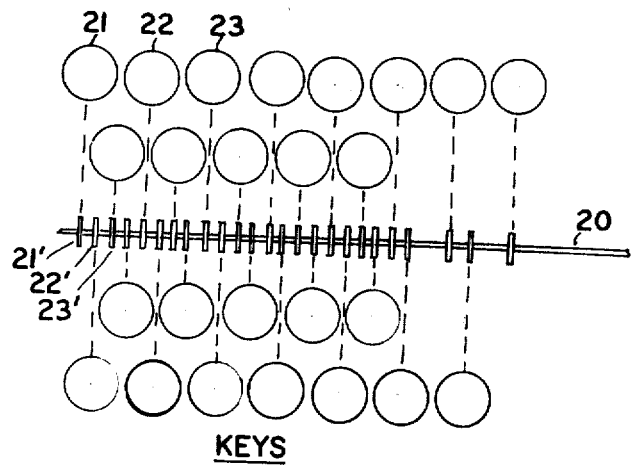
FIGS. 3 and 4 are schematic diagrams of other embodiments of the invention.

There are many methods of constructing the waveguide to decode the key position. To achieve the most economical method, the mechanical complexity vs. electronic complexity must be weighed to attain the best compromise. To implement Method 1, one approach of construction is shown in FIG. 3. A single waveguide 20 is used and the keys 21, 22, 23, etc., each have a magnet, 21', 22', 23', etc., associated in such a way that a discrete magnet gives a discrete delay that may be decoded for each key.

Figure 4:
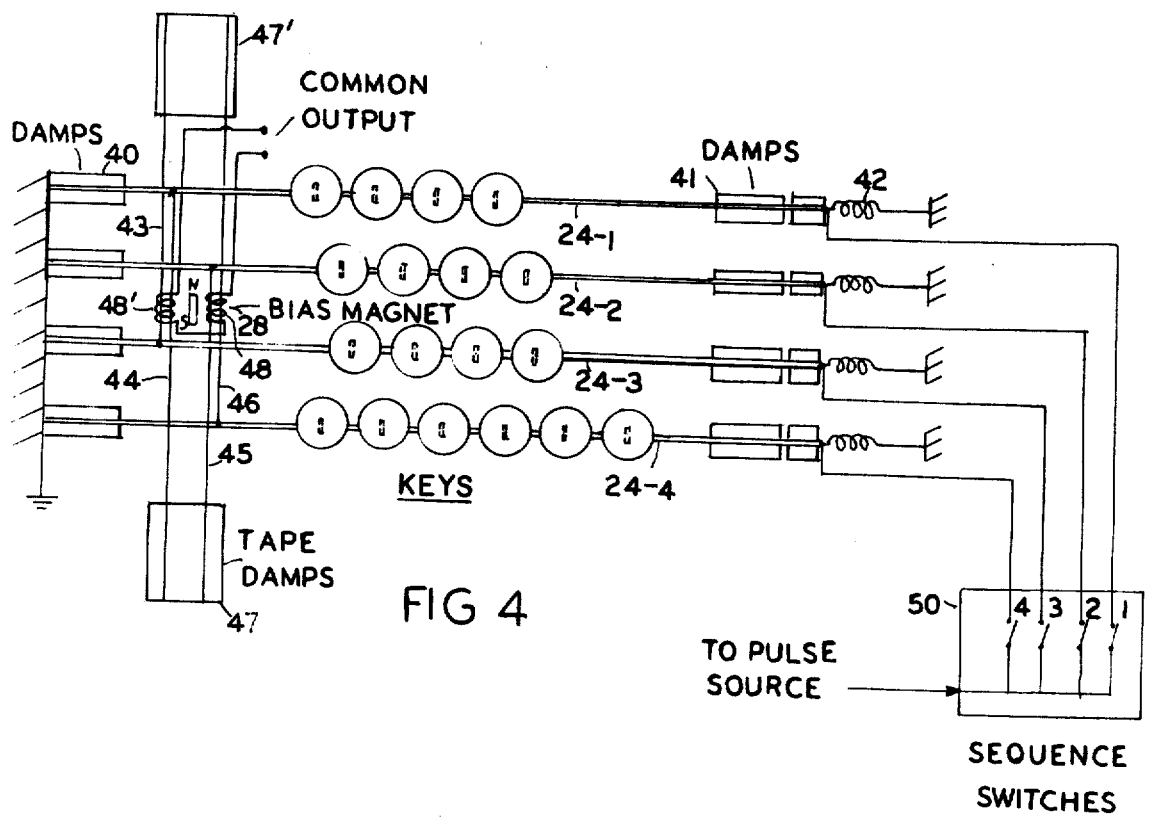

The embodiment of FIG. 4 uses individual waveguides under the keys. Each waveguide is mounted with damps 40, 41, and springs 42. The lines 24-1 to 24-4 of waveguide are selected by sequentially switching a pulse current to one line at a time with some sequence switches 50-1 to 50-4. These switches are preferably electronic. The output signals may all be received by tapes 43–46 connected to the waveguides. The tapes are damped by damps 47, 47'. A single coil block 28 contains the detector coils 48, 48' tied in series.

Supposing one of the keys in line 24-3 is depressed. The output signal will not occur until after the pulse current to line 24-3 is applied through the selection switch 50-3 in time sequence. Now, this signal will be delayed in time with respect to the pulse excitation depending on its position away from the pick off coil. Thus, the time of excitation of the pulses defines the row of the depressed key and its relation to that pulse in time defines its place within the row.

Systems Considerations

To implement a complete system, certain keys indicating shift or control have to be decoded simultaneously with the other normal key positions because each normal key may have other than its normal significance. This can be encoded electronically by separating the shift and control keys in a separate time frame, so that they can be identified without effecting the normal key decoding electronics. The combination of the shift and control key signals with the other key position code provide the total coded output information. The magnetically coded key method eliminates the need for determining the delay of a given key and then converting it to an acceptable code such as the ASCII code. Instead, direct code output can be obtained without additional electronic code converting chips. Coded keys, however, are mechanically more complex and their cost may offset the cost savings in the electronics.

Figure 5:
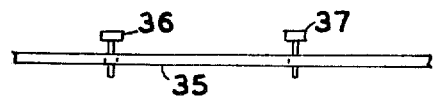
FIG. 5 is a detail view of a modification of the invention.

As shown in FIG. 5, a steel magnetic plate 35 can be used to isolate magnetic fields of the keys 36, 37, etc., to permit closer spacing without interference. Also, it minimizes further smaller residual signals generated with the magnet removed, a desirable distance, determined by human factor considerations.

The sonic waveguide is preferably of tubular construction for instance, about 0.020" OD and is of a magnetostrictive material such as nickel-iron. The tubular construction has less hysteresis effect than solid wire, i.e. less retentive effect when the magnet is withdrawn.

Solid wire, tubular and tubular with center wire waveguides may be used.

Longitudinal Signal Approach

If a coil is applied concentric to the waveguide, torsional as well as longitudinal output signal can be received, since the magnet location from the depressed key launches both longitudinal and torsional waves with the application of the applied pulse current. The tape structure described previously selectively filters the torsional signals, longitudinal waves cannot travel perpendicular into the tapes applied at a 90° angle to the waveguide. However, if a longitudinal bias field is carefully applied with the concentric coil, longitudinal signals can be received with less torsional signals. (Both will be received generally) The torsional signals will be received later than longitudinal signals since the torsional waves travel about 0.6 times the speed of the longitudinal waves. Thus, the longitudinal waves can be received first and any signals such as torsional types received later can be discriminated against. However, if several keys are depressed and the first and second must be identified as in "N Key rollover" requirements on some keyboards, the torsional signnal or noise received will interfere with the detection of more than one longitudinal output present. For example, a signal launched from the row near the receiver coil will launch a longitudinal pulse and some torsional signal. That torsional signal may be near or on top of a second longitudinal signal launched by a key further away from the receiver coil and cause ambiguities in the identification of more than one key. (See U.S. Pat. No. 3,173,131 for the concentric coil pick off).

It is claimed:

1. A keyboard encoding system comprising, a plurality of movable magnetic keys, a waveguide located in relation to the keys so that the magnetic field of the keys may be moved into operative magnetic engagement with the waveguide, means to apply a pulse to said waveguide whereby when one of the keys is moved into magnetic engagement with said waveguide, a signal will be produced, said signal being delayed relative to the applied pulse so that the key can be identified.

2. Apparatus as in claim 1, having means to magnetically code the keys, and means to scan the keys with a strobe train of pulses to thereby generate a coded signal for a depressed key.

3. Apparatus as in claim 2 wherein the code is a binary code.

4. Apparatus as in claim 1 having means to convert said time delayed signal into discrete digital information for operation with digital equipment.

5. Apparatus as in claim 1 wherein the waveguide is a tubular element.

6. Apparatus as in claim 5 wherein a conductive element is threaded through the tubular element to conduct the applied pulse.

7. Apparatus as in claim 1 wherein the keys have magnets which are bipolar on the end facing the waveguide.

8. Apparatus as in claim 1 wherein the waveguide is formed to couple a plurality of key rows.

9. Apparatus as in claim 1 wherein the applied pulse is applied or the received pulse is taken off between the ends of the waveguide to reduce the maximum attentuation.

10. Apparatus as in claim 1 wherein a shield is introduced to reduce the magnetic effect of retracted keys.

11. Apparatus as in claim 5 wherein a conductive element is threaded through the tubular element to conduct the delayed signal.

12. A keyboard encoding system comprising;

a plurality of movable magnetic keys, a plurality of waveguides located in relation to the keys so that the magnetic field of the keys may be moved into operative magnetic engagement with the waveguides, means to apply a pulse to said waveguides whereby when one of the keys is moved into magnetic engagement with one of said waveguides, a signal will be produced, said signal being delayed relative to the applied pulse so that the key can be identified, means to sequentially scan the waveguides and coil block means connected to the scanning means to detect generated signals from said waveguides.

* * * * *